United States Patent [19]

Brat et al.

[11] Patent Number: 4,820,393

[45] Date of Patent: Apr. 11, 1989

[54] TITANIUM NITRIDE SPUTTER TARGETS

[75] Inventors: Teodoro E. Brat, Reynoldsburg; Charles E. Wickersham, Columbus, both of Ohio

[73] Assignee: Tosoh SMD, Inc., Grove City, Ohio

[21] Appl. No.: 48,153

[22] Filed: May 11, 1987

[51] Int. Cl.$^4$ .................. C23C 14/34; C22C 32/00; C01B 21/076; C04B 35/58

[52] U.S. Cl. .................. 204/192.15; 204/192.21; 204/298; 419/13; 419/49; 423/411; 501/96

[58] Field of Search .................. 204/192.15, 192.21, 204/298; 419/13, 49; 423/411; 501/96

[56] References Cited

U.S. PATENT DOCUMENTS

| | | | |
|---|---|---|---|
| 3,036,888 | 5/1962 | Lowe | 423/111 |
| 3,451,772 | 6/1969 | McCabe et al. | 423/111 |
| 3,798,145 | 3/1974 | Fournier | 204/192.15 |
| 4,006,073 | 2/1977 | Welch | 204/298 |
| 4,544,468 | 10/1985 | Münz et al. | 204/192.15 X |
| 4,663,120 | 5/1987 | Parent et al. | 419/10 |

OTHER PUBLICATIONS

Nicolet, "Diffusion Barriers in Thin Films", *Thin Solid Films*, 52, 415 (1978).
Ting et al, "The Use of Titanium-Based Contact Barrier Layers in Silicon Technology", *Thin Solid Films*, 96, 327 (1982).
Wittmer, "Barrier Layers", Principles and Applications in Microelectronics, *J. Vac. Sci. Technol.*, A2(2), 273 (1984).
Sinke et al, "Oxygen in Titanium Nitride Diffusion Barriers", 1985.
Sinke et al, "Pre-Annealing of TiN Barriers in Al Metallization of Silicon", *Proc. Mat. Symp.*, 37, 623 (1985).
Kanamori, "Investigation of Reactively Sputtered TiN Films for Diffusion Barriers", *Thin Solid Films*, 136, 195 (1986).
Ostling et al, "A Comparative Study of the Diffusion Barrier Properties of TiN and ZrN", *Thin Solid Films*, 145, 81 (1986).

*Primary Examiner*—Donald R. Valentine
*Attorney, Agent, or Firm*—Biebel, French & Nauman

[57] ABSTRACT

The present invention provides a sputter target for the deposition of titanium nitride films. The sputter target has a target face comprising titanium nitride having a density of at least 90% of the theoretical density of 100% pure titanium nitride. The sputter target is prepared by subjecting titanium nitride powder to hot isostatic pressure.

13 Claims, No Drawings

TITANIUM NITRIDE SPUTTER TARGETS

BACKGROUND OF THE INVENTION

The present invention relates to titanium nitride (TiN) sputter targets, and more particularly, to TiN sputter targets formed by hot isostatic pressing; to a method for forming TiN films, and to TiN films formed by sputtering of the TiN targets.

The integration of a large number of components on a single integrated circuit chip requires sophisticated interconnections to minimize signal delays and simultaneously optimize the packing density. Aluminum has been widely used for contacts and interconnections in both bipolar and metal-oxide semiconductor (MOS) integrated circuits. However, the low-temperature interdiffusion of aluminum and silicon during contact sintering, passivation, or packaging of the device can result in gain degradation and increased junction leakage or even shorting of shallow junction devices. Device reliability can be improved by interposing a barrier layer between the Al and the Si which reduces the mass transport in the contact structure during processing or operation of the device.

TiN films have been proposed as diffusion barrier layers in very large scale integration (VLSI) metallization schemes and in solar cell top contacts. A TiN diffusion barrier layer prevents an undesired reaction between the contact metal such as aluminum and the substrate material such as silicon, and thus, permits the use of aluminum in cases where this would otherwise be prohibitive.

Reactive sputtering is a known method for forming TiN films. As those skilled in the art know, sputtering involves the transport of a material from a target to a substrate. Ejection of the target material is accomplished by bombarding the surface of the target with gas ions accelerated by high voltage. Particles of atomic dimensions are ejected from the target as a result of momentum transfer between incident ions and target material ions. These particles transverse the vacuum chamber and are subsequently deposited on the substrate in the form of a thin film.

To form a TiN film as part of a layered structure by reactive sputtering with $N_2$ for microelectronics applications, the Al target cannot be present with the Ti target in the sputtering chamber. If both targets are located in the same chamber, AlN may form. Therefore, in reactive sputtering a TiN film typically is formed on a layer such as $TiSi_2$ in a first sputtering chamber with a Ti target while an Al layer is formed on the TiN film in a second sputtering chamber with an Al target. As such, reactive sputtering is difficult to implement. According to Wittmer, "Barrier Layers: Principles and Applications in Microelectronics," *J. Vac. Sci. Technol.* A2(2), 273(1984), typical sensitivities for stoichiometric TiN thin films formed by reactive sputtering range between about 20 to 70 micron-ohm-cm. While these low resistivity levels are desirable they are difficult to achieve on an industrial scale.

Rapid thermal nitridization (RTN) is another method for forming TiN films. The method is advantageous because the TiN films are formed in situ. Typically, Ti is sputtered onto a substrate. The Ti film is then heated to about 1000° C. and $N_2$ is introduced so that a TiN film forms. The disadvantages of rapid thermal nitridization are that the TiN film thickness is difficult to control, the TiN film may be nonuniform, and hazardous gases such as $NH_3$ are present.

Sputtering of a TiN target wherein the target is formed by a hot press method is another known method for forming a TiN film. The TiN target is formed by applying heat and pressure simultaneously to TiN powder at temperatures high enough for sintering of the TiN powder to occur. TiN targets formed by this method have a density of about 75% of the theoretical density of 100% pure TiN. Resistivities for TiN films formed by sputtering of hot pressed formed TiN targets tends to be about 100 micron-ohm-cm.

A sputtering target and method are desired wherein a layered structure having a TiN film therein can be formed in one sputter chamber and the resulting TiN film has a resistivity of less than about 70 micron-ohm-cm.

SUMMARY OF THE INVENTION

It has been found that TiN films having resistivities on the order of 30 to 70 micron-ohm-cm are easily obtained by sputtering deposition using high density TiN targets. These targets are characterized by a density which is at least about 90% of the theoretical density of TiN. Typically these targets have a nominal purity of at least 99.99%. The targets typically are obtained by a hot isostatic pressing process.

The low resistivity of TiN films produced in accordance with the present invention is believed to be, at least in part, a function of the oxygen concentration in the sputtering targets. It is believed to be desirable for the sputter target to contain about 1,000 to 10,000 ppm (by weight) oxygen, and preferably, 5,000 to 7,000 ppm. Furthermore, the form in which the oxygen is present in the sputter target is also believed to be important.

Oxygen is known to play an important role in TiN films. As discussed in Nicolet, "Diffusion Barriers in Thin Films," *Thin Solid Films* 52, 415 (1973), some immiscible films do not function as barrier layers because rapid diffusion along grain boundaries and other structural defects occur. A remedy is to plug the diffusion paths with appropriate atoms or molecules, i.e., "stuffing" the barrier. When these paths are plugged by suitable impurities, the stuffed barrier can successfully withstand the heat treatment.

For example, when impurities such as oxygen stuff a TiN diffusion barrier layer, the oxygen is probably absorbed along the grain boundaries of the TiN diffusion barrier layer, and thus, prohibits Al from diffusing into the layer. Oxygen concentration in the TiN diffusion barrier layer may be increased by exposing the TiN diffusion barrier layer to air before Al deposition. Also, $Al_2O_3$ may be formed upon annealing which is known to be very effective against Al diffusion.

Although further work is required to confirm the observation, TiN films produced in accordance with the invention appear to contain a thin coating of titanium oxynitride, but the oxygen contained internally of the nitride is believed to be distributed along grain boundaries as titanium oxide. In the grain boundaries, the oxide effectively closes the diffusion pathway, and in so doing, contributes to the barrier properties of the film without severely compromising resistivity.

One manifestation of the present invention is a sputter target for depositing TiN film comprising a stage holding TiN having a density of at least 90% of the theoretical density of 100% pure TiN.

Another manifestation of the present invention is a process for depositing TiN films which comprises the steps of:

providing a TiN target having a density of at least 90% of the theoretical density of 100% pure TiN, and sputtering said target under conditions designed to deposit a TiN film on a substrate.

Still another manifestation of the present invention is a TiN film produced by the aforesaid process and more particularly, an integrated circuit having a TiN film as a barrier layer.

Other objects and advantages of the present invention will become apparent from the following description and appended claims.

DETAILED DESCRIPTION OF THE INVENTION

The TiN sputter target of the present invention is characterized by a density of at least 90% of theoretical, and most typically, about 92 to 95% of theoretical.

While other processes may be used to form the sputter target of the present invention, it is preferably formed by a process known as hot isostatic processing. In a typical process, a 1 micron TiN powder is placed in a steel hot isostatic pressing can. The powder is vibrated and compacted and the can is sealed. The can is evacuated to a pressure of about 10 to 100 microns and placed in a hot isostatic press.

Two sets of pressing conditions have been evaluated and found to be essentially equivalent. In one set, the press is operated at 1350° C. at 20,000 psi for 4 hours to produce the target. In the other set, the press is operated at 1350° C. and 15,000 psi for 2 hours.

After pressing, the can is removed from the press and the steel can is removed from the TiN target by machining. The TiN cake is cut into a shape such as a disc having a diameter of about 5 cm which can be placed in or bonded to a support in preparation for sputtering.

Both procedures yield a gold colored sputtering target having a density of 92-95% of theoretical target. X-ray diffraction indicates that the target material matches exactly a simulated stoichiometric TiN pattern. A typical elemental analysis for the impurities in a sputter target in accordance with the present invention is shown in Table 1.

TABLE 1

| ELEM. | Si | Al | Ca | Co | Cr | Cu | Fe | Mg | Mn |
|---|---|---|---|---|---|---|---|---|---|
| PPM | ND | ND | 11 | 5 | 6 | 13 | 52 | ND | 13 |

TABLE 1-continued

| ELEM. | Ni | Mo | NA | K | Li | U | TH |
|---|---|---|---|---|---|---|---|
| PPM | 15 | 5 | 1.8 | ND | ND | 0.010 | 0.027 |

Sputtering involves transporting material from the TiN target to a substrate. The ejection of the TiN target material is accomplished by bombarding the surface of the TiN target with gas ions accelerated by high voltage. Typically, ultra high purity argon is used. Molecular size particles are ejected from the TiN target as a result of momentum transfer between incident ions and atoms of the TiN target material. These particles traverse the vacuum chamber and are subsequently deposited on the substrate as a thin film. Typically, the TiN target is water cooled.

A magnetron sputtering system is particularly useful in the present invention. Useful sputtering systems are commercially available. Typically, the TiN deposition rate is high and ranges from about 35 to 40 angstroms/sec. The TiN can be deposited on the substrate to a desired thickness. Because conductivity is an intrinsic property, i.e., a property which exists independent of dimensions, the film thickness can be varied as desired to meet a given application. Typically, the thickness of the TiN films ranges from about 100 to 300 nm.

Table 2 contains useful sputtering conditions and the properties of the resulting TiN films. The deposition rate was about 38 angstrom/sec and the TiN film thickness was about 180 nm. The substrate temperature is in °C. while the bias in in direct-current volts.

TABLE 2

| | SPUTTERING CONDITIONS | | | | STOICHIOMETRY | | | | | RESISTIVITY RS | |
|---|---|---|---|---|---|---|---|---|---|---|---|
| Sample # | Substrate Temp. [°C.] | Bias VDC | N2 [SCC] | Spacing [angstroms] | Ti | N | O | Ti/N | N/O | [ohms/area] | [micro-ohm-cm] |
| 1 | — | — | — | 2.47 / 2.140 | 0.462 | 0.473 | 0.065 | 0.98 | 7.3 | 2.67 | 47 |
| 2 | — | 550 | — | 2.473 / 2.135 | 0.475 | 0.480 | 0.045 | 0.99 | 10.7 | 2.66 | 47 |
| 3 | — | — | 100 | 2.479 / 2.154 | 0.460 | 0.485 | 0.055 | 0.95 | 8.8 | 3.65 | 65 |
| 4 | — | 550 | 100 | 2.486 / 2.154 | 0.478 | 0.475 | 0.047 | 1.00 | 10.1 | 3.64 | 65 |
| 5 | 400 | — | — | 2.467 / 2.130 | 0.475 | 0.465 | 0.060 | 1.02 | 7.8 | 2.21 | 39 |
| 6 | 400 | 750 | — | 2.465 / 2.130 | 0.470 | 0.470 | 0.060 | 1.00 | 7.8 | 2.20 | 38 |
| 7 | 400 | 700 | 100 | 2.467 / 2.133 | 0.450 | 0.492 | 0.058 | 0.91 | 8.4 | 2.88 | 51 |

The stoichimetry in atomic % of Table 2 was determined by Rutherford Backscattering Spectrometry (RBS). As those skilled in the art know, RBS is a nondestructive analytical technique which provides an in-depth profile of the elements constituting a thin film system. As indicated, Ti, N, and O were present as principal components of the films. No argon gas was detected in the films within the sensitivity of the RBS technique. Ti to N atomic ratios in the films varied from 0.9 to 1.02 according to RBS results. It is evident that stoichiometry is strongly dependent on the sputtering conditions as shown in Table 2.

The resistivities as shown in Table 2 range from 38 to 65 micron-ohm-centimeters. Acceptable resistivities range from about 30 to 70-micron-ohm-centimeters. As shown in Table 2, heating the substrate resulted in films having resistivities from 38 to 51 micron-ohm-centimeters. Bias apparently does not affect the resistivity of the film. The film samples were gold in color.

The depth profile composition of Table 3 below was determined by Electron Spectroscopy for Chemical Analysis (ESCA). As those skilled in the art know, ESCA is a form of electron spectroscopy in which a sample is irradiated with a beam of monochromatic x-rays and the energies of the resulting photoelectrons are measured. The sputtering rate was 20 angstroms/-minute and the accuracy of the results is + or −10%. The binding energies indicated that Ti and N are present in compound form. The ESCA profile analysis shows that the film surface comprises titanium oxynitrides ($Ti_xO_yN$) while the film interior comprises TiN.

TABLE 3

| SPUTTERING TIME [Min] | ELEMENT % | | | | |
|---|---|---|---|---|---|
| | Ti | N | O | C | Si |
| SAMPLE A | | | | | |
| 9 | 51.08 | 44.12 | 3.12 | 1.69 | 0.27 |
| 48 | 53.08 | 44.25 | 1.92 | 0.77 | 0.00 |
| 99 | 53.26 | 43.75 | 1.92 | 1.07 | 0.00 |
| SAMPLE B | | | | | |
| 9 | 52.99 | 43.61 | 2.74 | 0.67 | 0.00 |
| 48 | 52.62 | 43.76 | 2.91 | 0.62 | 0.00 |
| 99 | 54.45 | 43.06 | 1.55 | 0.94 | 0.00 |

X-ray diffraction was used to determine the film structure. TiN has a face-centered cubic structure (FCC) comparable to sodium chloride (NaCl). TiO is isomorphic with TiN. X-ray diffraction indicated that the TiN target material matches exactly a simulated stoichiometric TiN pattern while the deposited TiN film shows a shift in the crystallographic plane spacing of the (111) and (200) reflections.

Table 4 shows a comparison of the properties of TiN films formed by: (1) the present invention—sputtering of a TiN target formed by hot isostatic pressing, (2) reactive sputtering of a Ti target, and (3) rapid thermal nitridization (RTN) of Ti/Si (100) in $N_2$.

TABLE 4

| | (1) TiN Target | (2) Reactive Sputtered | (3) RTN |
|---|---|---|---|
| RESISTIVITY [micron-ohm-cm] | 40 | 160 | 100 |
| DEPOSITION RATE [angstrom/sec] | 40 | 10 | — |
| FILM THICKNESS [angstroms] | 1800 | 1000 | 1000 |
| DIFFUSION BARRIER TEMPERATURE Al/TiN/TiSi$_2$/Si (100) [°C.-60 min.] | 560 | 500 | 500 |
| FILM THICKNESS (NO PEELING) [angstroms] | At Least 4000 | At Least 2000 | At Least 2000 |

As Table 4 shows, a TiN film formed by the present invention yielded the lowest resistivity, i.e., 40 micron-ohm-cm and the fastest deposition rate, i.e., 40 angstroms/sec.

Each TiN film was formed as a diffusion barrier in a Al/TiN/TiSi$_2$/Si(100) structure to determine thermal stability. The diffusion barrier temperature is the highest temperature at which the layered structure remained thermally stable for 60 minutes. With an Al/TiN/TiSi$_2$/Si(100) layered structure, the Al reacts with the TiN to form AlN and Al$_3$Ti. Eventually the interdiffusion of Al and Si can result in grain degradation and increased junction leakage or even shorting of shallow junction devices. The TiN film formed by the present invention yielded, at 60 minutes, the highest diffusion barrier temperature, i.e., 560° C.

Based on the foregoing discussion, the TiN films of the present invention are particularly useful in integrated circuits as diffusion barrier layers in layered structures such as Al/TiN/Si and Al/TiN/TiSi$_2$/Si. The TiN films have also been studies for use as local interconnects, contacts between metals and silicides, blocking Ti-Pt reaction, highly stable solar cells, and as a sticking layer for CVD tungsten. The TiN films can also be used as etch stop layers for reactive ion etching.

Having described the invention in detail and by reference to preferred embodiments thereof, it will be apparent that modifications and variations are possible without departing from the scope of the invention defined in the appended claims.

What is claimed is:

1. A sputter target for deposition of titanium nitride films having a target face comprising titanium nitride having a density of at least 90% of the theoretical density of 100% pure titanium nitride.

2. The sputter target of claim 1 wherein said titanium nitride has a density of about 92 to 95% of the theoretical density of 100% pure titanium nitride.

3. The sputter target of claim 1 wherein said target is prepared by subjecting titanium nitride powder to hot isostatic pressure.

4. The sputter target of claim 3 wherein said titanium nitride powder is subjected to hot isostatic pressure at about 1350° C. and about 20,000 psi for about 4 hours.

5. The sputter target of claim 3 wherein said titanium nitride powder is subjected to hot isostatic pressure at about 1350° C. and about 15,000 psi for about 2 hours.

6. A titanium nitride film having a resistivity of about 30 to 70 micron-ohm-centimeters wherein said titanium nitride film is prepared by providing a titanium nitride target having a density of at least 90% of the theoretical density of 100% pure titanium nitride, and sputtering said titanium nitride target to deposit a titanium nitride film.

7. The titanium nitride film of claim 6 wherein said film is characterized in that said oxygen is present in the form of titanium oxynitrides at the surface of said film and as titanium oxide internally of said film, said titanium oxide being located along grain boundaries.

8. The titanium nitride film of claim 6 wherein said titanium nitride film is useful as a diffusion barrier layer in an integrated circuit.

9. The titanium nitride film of claim 6 wherein said titanium nitride film is useful as an etch stop layer.

10. A process for depositing a titanium nitride film on a substrate comprising the steps of
providing a titanium nitride target having a density of at least 90% of the theoretical density of 100% pure titanium nitride; and
sputtering said target under conditions designed to deposit a titanium nitride film on said substrate.

11. The process of claim 10 wherein said step of providing said target includes subjecting a titanium nitride powder to hot isostatic pressing.

12. A sputter target for deposition of titanium nitride films having a target face comprising titanium nitride having a density of at least 90% of the theoretical density of 100% pure titanium nitride, said titanium nitride comprising about 1,000 to 10,000 ppm by weight oxygen.

13. The sputtering target of claim 12 wherein said titanium nitride contains about 5000 to 7000 ppm by weight oxygen.

* * * * *